(12) United States Patent
von Malm

(10) Patent No.: US 9,082,932 B2
(45) Date of Patent: Jul. 14, 2015

(54) OPTOELECTRONIC SEMICONDUCTOR CHIP HAVING N-CONDUCTING REGION CONNECTED FROM THE P-TYPE SIDE VIA THE SINGLE N-TYPE CONTACT ELEMENT

(75) Inventor: Norwin von Malm, Nittendorf-Thumhausen (DE)

(73) Assignee: OSRAM Opto Semiconductors GmbH (DE)

( * ) Notice: Subject to any disclaimer, the term of this patent is extended or adjusted under 35 U.S.C. 154(b) by 141 days.

(21) Appl. No.: 13/636,798

(22) PCT Filed: Mar. 10, 2011

(86) PCT No.: PCT/EP2011/053638
§ 371 (c)(1),
(2), (4) Date: Nov. 28, 2012

(87) PCT Pub. No.: WO2011/120775
PCT Pub. Date: Oct. 6, 2011

(65) Prior Publication Data
US 2013/0099272 A1    Apr. 25, 2013

(30) Foreign Application Priority Data

Mar. 31, 2010    (DE) .......................... 10 2010 013 494

(51) Int. Cl.
*H01L 33/00* (2010.01)
*H01L 29/15* (2006.01)
(Continued)

(52) U.S. Cl.
CPC ............ *H01L 33/36* (2013.01); *H01L 25/0753* (2013.01); *H01L 33/20* (2013.01); *H01L 33/385* (2013.01); *H01L 27/153* (2013.01);
*H01L 33/0079* (2013.01); *H01L 33/22* (2013.01); *H01L 33/405* (2013.01); *H01L 33/44* (2013.01)

(58) Field of Classification Search
CPC ....... H01L 33/20; H01L 33/36; H01L 33/385; H01L 27/153; H01L 33/0079; H01L 33/44; H01L 33/405; H01L 33/22; H01L 25/0753
USPC ........ 257/99, 93, 77, 88, 95, 98, 103; 438/22, 438/34, 42
See application file for complete search history.

(56) References Cited

U.S. PATENT DOCUMENTS 4,956,683 A    9/1990  Quintana
5,793,405 A *  8/1998  Shakuda ...................... 347/238
(Continued)

FOREIGN PATENT DOCUMENTS

CN       101076900       11/2007
DE     10 2007 02294    10/2008
(Continued)

OTHER PUBLICATIONS

Hsieh, C., "Epistar's Chips Plug and Play," *Compound Semiconductor*, 2009, vol. 15, No. 4, cover, pp. 18-20.
(Continued)

*Primary Examiner* — Long K Tran
*Assistant Examiner* — Dzung Tran
(74) *Attorney, Agent, or Firm* — DLA Piper LLP (US)

(57) ABSTRACT

An optoelectronic semiconductor chip includes a semiconductor body, having an n-conducting region and a p-conducting region, and a single n-type contact element, via which the n-conducting region can be electrically contact-connected through the p-conducting region.

11 Claims, 7 Drawing Sheets

(51) Int. Cl.
  *H01L 29/18* (2006.01)
  *H01L 21/00* (2006.01)
  *H01L 33/36* (2010.01)
  *H01L 25/075* (2006.01)
  *H01L 33/20* (2010.01)
  *H01L 33/38* (2010.01)
  *H01L 27/15* (2006.01)
  *H01L 33/22* (2010.01)
  *H01L 33/44* (2010.01)
  *H01L 33/40* (2010.01)

(56) References Cited

U.S. PATENT DOCUMENTS

| | | | |
|---|---|---|---|
| 2006/0006404 A1* | 1/2006 | Ibbetson et al. | 257/99 |
| 2006/0097278 A1* | 5/2006 | Goto et al. | 257/103 |
| 2007/0126016 A1* | 6/2007 | Chen et al. | 257/96 |
| 2009/0101923 A1* | 4/2009 | Choi et al. | 257/89 |
| 2009/0267085 A1* | 10/2009 | Lee et al. | 257/88 |
| 2009/0272971 A1* | 11/2009 | Lee et al. | 257/43 |
| 2010/0171135 A1 | 7/2010 | Engl et al. | |
| 2012/0018763 A1 | 1/2012 | Engl et al. | |
| 2012/0086026 A1 | 4/2012 | Engl et al. | |

FOREIGN PATENT DOCUMENTS

| | | |
|---|---|---|
| DE | 10 2008 01184 | 9/2009 |
| DE | 10 2008 03456 | 2/2010 |
| DE | 10 2010 002 204 A1 | 8/2011 |
| JP | 2008-523637 | 7/2008 |
| WO | 2008/131735 | 11/2008 |
| WO | 2009/106063 | 9/2009 |
| WO | 2010/009690 | 1/2010 |
| WO | 2011/101280 A1 | 8/2011 |

OTHER PUBLICATIONS

English translation of the Chinese Official Action dated Sep. 30, 2014 corresponding to Chinese Patent Application No. 201180017495.3.
English translation of Japanese Notice of Reasons for Rejection dated Nov. 19, 2013 for Japanese Patent Application No. 2013-501715.

* cited by examiner

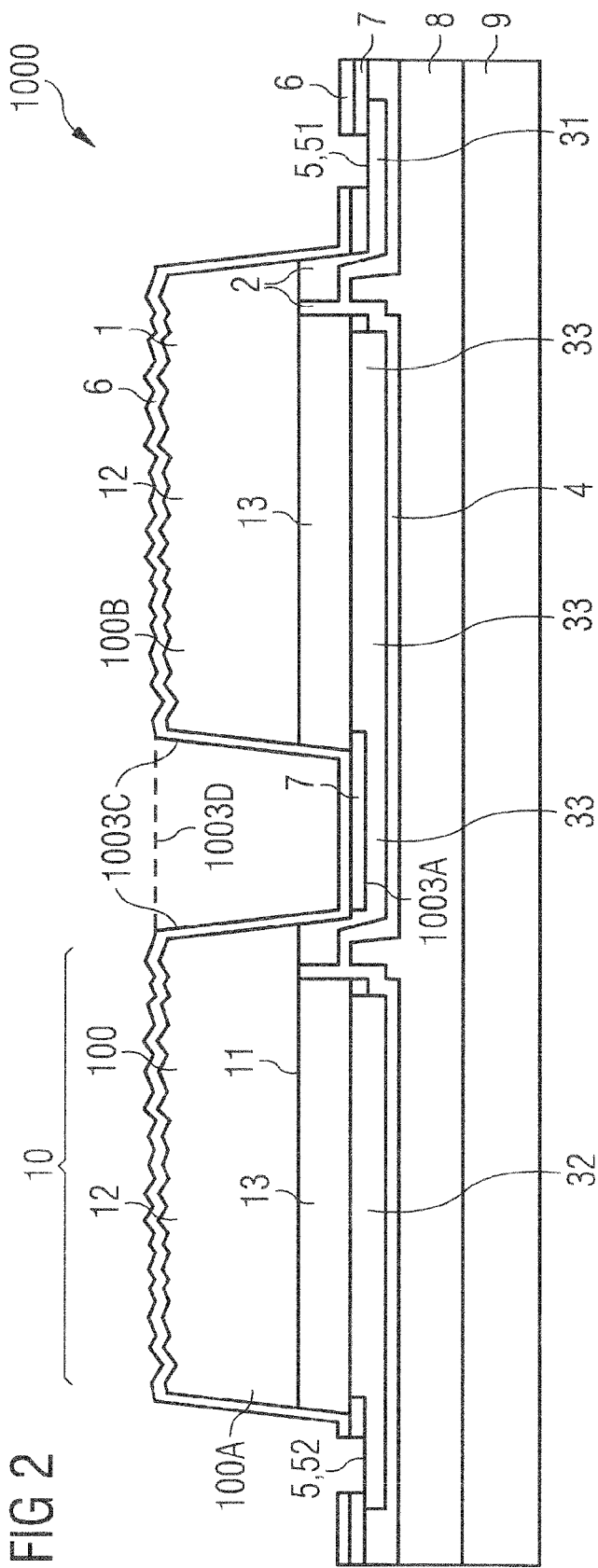

OPTOELECTRONIC SEMICONDUCTOR CHIP HAVING N-CONDUCTING REGION CONNECTED FROM THE P-TYPE SIDE VIA THE SINGLE N-TYPE CONTACT ELEMENT

RELATED APPLICATIONS

This is a §371 of International Application No. PCT/EP2011/053638, with an international filing date of Mar. 10, 2011, which is based on German Patent Application No. 10 2010 013 494.5, filed Mar. 31, 2010, the subject matter of which is incorporated by reference.

TECHNICAL FIELD

This disclosure relates to an optoelectronic semiconductor chip, an optoelectronic semiconductor device and also a method for producing an optoelectronic semiconductor device. In particular, this disclosure relates to a particularly compact semiconductor chip which can be produced cost-effectively.

SUMMARY

I provide an optoelectronic semiconductor chip including a semiconductor body, having an n-conducting region and a p-conducting region, and a single n-type contact element, via which the n-conducting region can be electrically contact-connected through the p-conducting region.

I also provide an optoelectronic semiconductor device including at least two optoelectronic semiconductor chips, wherein the optoelectronic semiconductor chips are electrically contact-connected to one another in a series circuit, the n-conducting region of a semiconductor chip is electrically connected to the p-conducting region of an adjacent semiconductor chip via a continuous intermediate metallization, and the intermediate metallization is formed at least in selected places by the n-type contact metallization of a semiconductor chip and by the p-type contact metallization of an adjacent semiconductor chip.

I further provide a method of producing an optoelectronic semiconductor device including providing a growth carrier, applying an epitaxially grown semiconductor layer sequence to the growth carrier, wherein the semiconductor layer sequence has an n-conducting region and a p-conducting region, producing at least two n-type contact elements in the semiconductor layer sequence, wherein the n-type contact elements extend through the p-conducting region right into the n-conducting region, applying an auxiliary carrier to an area of the semiconductor layer sequence which lies opposite the growth carrier, and subsequently removing the growth carrier from the semiconductor layer sequence, and producing individual semiconductor bodies by introducing at least one trench via the n-conducting region between n-type contact elements that are adjacent in a lateral direction, wherein parts of the semiconductor layer sequence are completely removed at least in selected places in the region of the trench.

I additionally provide an optoelectronic semiconductor chip including a semiconductor body having an n-conducting region and a p-conducting region, and a single n-type contact element, via which the n-conducting region can be electrically contact-connected through the p-conducting region, wherein the n-type contact element comprises a cutout in the p-conducting region, and the n-type contact element laterally delimits the p-conducting region at least in selected places.

BRIEF DESCRIPTION OF THE DRAWINGS

FIGS. 2, 3, 4 and 5 show schematic sectional illustrations of individual examples of an optoelectronic semiconductor device described here.

DETAILED DESCRIPTION

Figure 1A:
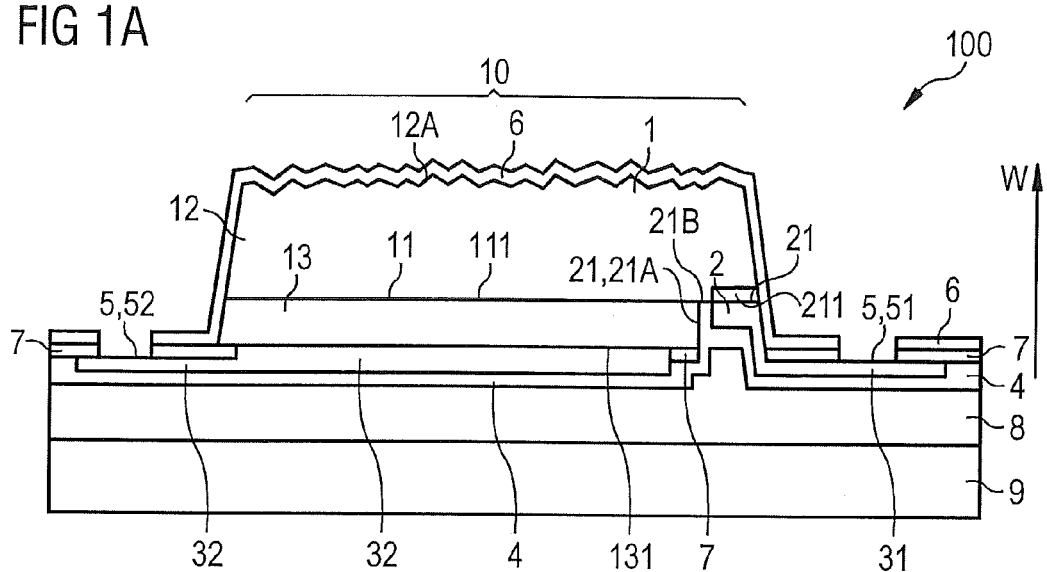
FIGS. 1A and 1B show a side view and plan view of an example of an optoelectronic semiconductor chip described here.

The optoelectronic semiconductor chip may comprise a semiconductor body having an n-conducting region and a p-conducting region. N- and p-conducting regions can be formed at least in places by epitaxially grown semiconductor layer sequences of the semiconductor body.

The optoelectronic semiconductor chip may comprise a single n-type contact element, via which the n-conducting region can be electrically contact-connected through the p-conducting region. In other words, the n-conducting region is therefore electrically contact-connected from the p-type side through the p-conducting region. In this case, "a single n-type contact element" means that the n-type contact element is not formed by a multiplicity of individual n-type contact elements, for example, n-type contact elements separated from one another by semiconductor material of the semiconductor body. Rather, the single n-type contact element is a contact element which extends contiguously and continuously within the semiconductor body and directly adjoins semiconductor material of the semiconductor body laterally at least in places.

To provide an optoelectronic semiconductor device which is particularly simple in its construction and also aging-stable and cost-effective, the optoelectronic semiconductor chip makes use of the concept, inter alia, of making the n-conducting region of a semiconductor body of the semiconductor chip electrically contact-connectable via a single n-type contact element running through the p-conducting region of the semiconductor body. Application of a contact-connection to outer areas of the n-side region or a multiplicity of individual contact elements can thus advantageously be dispensed with since the n-conducting region is contact-connected from the p-type side via the single n-type contact element.

The optoelectronic semiconductor chip may comprise a semiconductor body having an n-conducting and a p-conducting region. Furthermore, the optoelectronic semiconductor chip may comprise a single n-type contact element, via which the n-conducting region can be electrically contact-connected through the p-conducting region.

The n-type contact element may comprise a cutout in the p-conducting region. In this context, "cutout" means that semiconductor material of the p-conducting region is removed in places in the region of such a cutout. Therefore, the cutout is delimited by the p-conducting region at least in places in a lateral direction, that is to say in a direction parallel to a main extension plane of the semiconductor body. It is possible for the cutout to be formed by at least one side area, a bottom area and also an opening opposite the bottom area. The bottom area and the opening are then connected to one another by the at least one side area. The at least one side area can be formed completely by semiconductor material of the p-conducting region. Furthermore, the bottom area of the cutout can be formed completely by the semiconductor material of the n-conducting region. In other words, a vertical extent, that is to say the extent of the cutout in a direction perpendicular to the main extension plane of the semiconductor body, is at least in places a vertical extent, that is to say thickness of the p-conducting region. The cutout is then a hole in the p-conducting region which completely penetrates through the latter.

The n-type contact element, in particular the cutout, may laterally delimit the p-conducting region at least in places. By way of example, the cutout then bounds the p-conducting region at least in places. It is likewise possible for the cutout to delimit the p-conducting region on all sides in a lateral direction. In a plan view of the semiconductor chip, the cutout is then "circumferential" and forms a contiguous zone.

The n-type contact element may have an n-type connection pad formed by a semiconductor material of the n-conducting region, wherein the n-type connection pad runs perpendicularly to a growth direction of the semiconductor body. If the single n-type contact element comprises a cutout in the p-conducting region, then it is possible for the n-type connection pad to be completely formed by the bottom area of the cutout. If the cutout is circumferential, for example, then it is possible for the n-type connection pad likewise to run circumferentially, for example, in a plan view circularly, rectangularly and/or in oval fashion, around the p-conducting region.

The semiconductor body may have an active zone, wherein the n-type connection pad of the n-type contact element amounts to at least 1% and at most 10%, preferably at least 2% and at most 5%, of a cross-sectional area of the active zone. The active zone can be a layer which emits electromagnetic radiation in a wavelength range within the ultraviolet to infrared spectral range of the electromagnetic radiation during operation of the semiconductor chip. The active zone is arranged between the n-conducting region and the p-conducting region. The cross-sectional area of the active zone is in this case the area running perpendicularly to the growth direction of the semiconductor body. It has been found that such an area range of the n-type contact element in relation to the cross-sectional area of the active zone produces a particularly favorable contact resistance. By way of example, with an n-type connection pad constituted in this way, it is possible to avoid particularly high evolution of heat in the region of the connection pad upon electrical contact-connection.

A ratio of a maximum lateral extent of the active zone and an n-type transverse conductivity of the n-conducting region is at least 2 µm/(Ω/sq) and at most 8 µm/(Ω/sq), preferably at least 3 µm/(Ω/sq) and at most 5 µm/(Ω/sq). If the active zone is circular, for example, in a plan view, the maximum lateral extent can be a diameter of the active zone. For the case where the active zone is rectangular, for example, the maximum lateral extent can be a diagonal distance between two corner points of the active zone. In this case, the geometrical dimensions of the active zone are chosen such that the n-type transverse conductivity of the n-conducting region suffices to produce a substantially homogeneous current distribution in the n-conducting region during the operation of the optoelectronic semiconductor chip such that the active zone itself emits electromagnetic radiation as homogeneously as possible along its cross-sectional area. In this case, "substantially" means that the current distribution along the n-conducting region is constant to the extent of at least 80%, preferably to the extent of at least 90%.

The semiconductor body may have a radiation coupling-out area arranged at that side of the n-conducting region remote from the p-conducting region. By way of example, the radiation coupling-out area is formed completely by that side of the n-conducting region remote from the p-conducting region. It is likewise possible for one or a plurality of layers to be applied to free places of the n-conducting region. By way of example, a passivation layer is then applied to free places of the n-conducting region. That side of the passivation layer remote from the p-conducting region can then form the radiation coupling-out area.

The n-type contact element may have an n-type contact metallization, which adjoins the n-type connection pad at least in places. With the n-type contact metallization, the n-conducting region can be electrically contact-connected via the n-type connection pad of the n-type contact element. If the n-type contact element comprises a cutout, for example, then it is possible for the n-type contact metallization to be in direct contact with the n-type connection pad over the entire lateral extent thereof, wherein a passivation layer, for example, an electrical insulation layer, is arranged between the n-type contact metallization and the p-conducting region. By way of example, the cutout is then at least partly filled with a metal.

The p-conducting region may have a p-type connection pad lying opposite the radiation coupling-out area, wherein the p-type connection pad is electrically conductively connected to a p-type contact metallization. By way of example, the p-type contact metallization is in direct contact with the p-type connection pad. It is likewise possible for one or a plurality of electrically conductive layers, for example, mirror layers, to be arranged between the p-type contact metallization and the p-type connection pad at least in places.

The n-type contact metallization and the p-type contact metallization may be led out from the semiconductor body in a lateral direction and not overlap one another in a vertical direction. In other words, the n-type contact metallization and the p-type contact metallization may be arranged in a manner offset with respect to one another in a lateral direction. By way of example, this can be achieved particularly advantageously by the n-type contact metallization and the p-type contact metallization being produced by a contact layer structured such that the n-type and p-type contact metallizations do not overlap in a vertical direction. Therefore, both the n-conducting and the p-conducting regions are "laterally" electrically contact-connected externally via the n-type contact metallization and the p-type contact metallization.

An insulation layer may be arranged between the p-conducting region and the n-type contact metallization in the region of the cutout. Preferably, the insulation layer is in direct contact both with the p-type contact metallization and with the n-conducting region and electrically insulates the n-conducting region and the p-type contact metallization from one another.

The p-conducting region may be laterally delimited in places by a nominally undoped semiconductor region, wherein the nominally undoped semiconductor region and the p-conducting region are formed by a continuous and contiguous semiconductor layer. In this context, "nominally undoped" means that the semiconductor region has a negligible effective doping in comparison with p-conducting and/or n-conducting region(s) directly adjoining the semiconductor region. By way of example, the nominally undoped semiconductor region is a semiconductor region whose semiconductor material has a high electrical resistance in comparison with the n-conducting and/or p-conducting region(s). Preferably, the nominally undoped semiconductor region is formed from the semiconductor material of the p-conducting region. By way of example, for this purpose the p-conducting region is altered in the region of the later nominally undoped semiconductor region by ion implantation or plasma treatment to form the nominally undoped semiconductor region. Advantageously, the nominally undoped region can serve as an insulation layer such that additional introduction of an insulation layer between the n-conducting region and the p-type contact metallization can advantageously be dispensed with.

The n-type contact element may be formed at least in places by an overdoped n-conducting semiconductor material of the p-conducting region. For example, the p-conducting region may be altered in its doping at places of the overdoped semiconductor material by ion implantation or plasma treatment method, for example, such that, by the method, the semiconductor material of the p-conducting region is n-conducting at those places. Advantageously, the n-type contact element can then be formed at least partly by the overdoped semiconductor material such that, for example, contact metallizations in the region of the n-type contact element can be at least partly dispensed with. The overdoped n-conducting semiconductor material can then partly replace the n-type contact metallization.

An optoelectronic semiconductor device is furthermore provided.

The optoelectronic semiconductor device may comprise at least two optoelectronic semiconductor chips. That is to say that the features presented for the optoelectronic semiconductor chip described here are also disclosed for the optoelectronic semiconductor device described here.

The optoelectronic semiconductor chips may be electrically contact-connected to one another in a series circuit. What is thus achieved is that the optoelectronic semiconductor device has a significantly lower current flow in an operation mode at predeterminable brightness. The optoelectronic semiconductor device can therefore be fed in a voltage-driven fashion with at the same time low currents. As a result, for example, expensive driver stages and high-current sources can be replaced by corresponding high-voltage sources, which are easy to manufacture.

The n-conducting region of a semiconductor chip may be electrically connected to the p-conducting region of an adjacent semiconductor chip via a continuous intermediate metallization.

The intermediate metallization may be formed at least in places by the n-type contact metallization of a semiconductor chip and by the p-type contact metallization of an adjacent semiconductor chip. In other words, the respective contact metallizations which may be led out laterally from the respective semiconductor bodies in a direction towards one another are "connected" together to form an intermediate metallization such that, with the intermediate metallization, the n-conducting region of one semiconductor chip is at the same electrical potential as the p-conducting region of the adjacent semiconductor chip.

The optoelectronic semiconductor device may comprise at least two optoelectronic semiconductor chips, wherein the optoelectronic semiconductor chips are electrically contact-connected to one another in a series circuit. The n-conducting region of a semiconductor chip is electrically connected to the p-conducting region of an adjacent semiconductor chip via a continuous intermediate metallization. The intermediate metallization is formed at least in places by the n-type contact metallization of a semiconductor chip and by the p-type contact metallization of an adjacent semiconductor chip. What is particularly advantageous is a series circuit formed by a number of semiconductor chips that is precisely enough that the optoelectronic semiconductor device, in the case of a predeterminable energization magnitude, can be operated with one of the following preferred voltage magnitudes applied externally to the semiconductor device: 55 V, 53$\sqrt{2}$ V, 110 V, 110$\sqrt{2}$ V, 220 V, 200$\sqrt{2}$ V.

An assemblage consisting of the optoelectronic semiconductor chips and the metallizations may be applied on an auxiliary carrier. That can mean that the assemblage is in direct contact with the auxiliary carrier. It is likewise possible for one or a plurality of layers to be arranged between the assemblage and the auxiliary carrier. The auxiliary carrier is different from a growth substrate. By way of example, the auxiliary carrier is a mechanically stable layer or a plate formed with a metal, for example. The auxiliary carrier can likewise be a semiconductor wafer.

Furthermore, a method for producing an optoelectronic semiconductor device is provided. By way of example, a semiconductor device as described in conjunction with one or more of the examples mentioned above can be produced by the method. That is to say that the features presented for the optoelectronic semiconductor device described here are also disclosed for the method described here and vice versa.

In a first step, a growth carrier is provided. The growth carrier can be embodied, for example, in the manner of a wafer or a plate. By way of example, the growth carrier is a monocrystalline wafer formed with a semiconductor or insulation material.

In a next step, a semiconductor layer sequence is deposited epitaxially onto the growth carrier, wherein the semiconductor layer sequence has an n-conducting region and a p-conducting region.

In a further step, at least two n-type contact elements are produced in the semiconductor layer sequence, wherein the n-type contact elements extend through the p-conducting region right into the n-conducting region. By way of example, the two n-type contact elements comprise a cutout. It is then possible for the cutouts to be introduced into the semiconductor layer sequence by a dry- or wet-chemical etching process. In this context, "extend into" means that the n-type contact elements have at least one vertical extent which, at least in places, corresponds at least to the vertical extent of the p-conducting region. In other words, the n-type contact elements then directly adjoin the semiconductor material of the n-conducting region in places. However, the contact elements can also have a vertical extent greater than that of the n-conducting region.

In a next step, an auxiliary carrier is applied to that area of the semiconductor layer sequence which lies opposite the growth carrier. In this case, the auxiliary carrier need not necessarily be in direct contact with the semiconductor layer sequence. By way of example, one or a plurality of layers, such as metallizations, for example, can be arranged between the auxiliary carrier and the semiconductor layer sequence. In this case, the metallizations can serve for the later electrical contact-connection of the optoelectronic semiconductor device. The auxiliary carrier can once again be a semiconductor wafer such as a wafer or plate.

In a next step, individual semiconductor bodies are produced by introducing at least one trench via the n-conducting region between n-type contact elements that are adjacent in a lateral direction. Parts of the semiconductor layer sequence are completely removed at least in places in the region of the trench. By way of example, the at least one trench is introduced into the semiconductor layer sequence by at least one dry- and/or wet-chemical etching process or some other form of material removal. That is to say that the at least one trench is laterally delimited by the semiconductor layer sequence at least in places. In this context, it is possible for the at least one trench to have a bottom area lying opposite an opening of the trench, and also two side areas connected to one another by the bottom area. The side areas can then be formed completely by the semiconductor layer sequence, wherein the bottom area of the trench is formed, for example, by the surface of the auxiliary carrier. The trench is therefore a cutout in the semiconductor layer sequence.

An optoelectronic semiconductor device described here may be produced by the method.

The optoelectronic semiconductor chip described here, the optoelectronic semiconductor device described here, and also the method described here are explained in greater detail below on the basis of examples and the associated figures.

In the examples and the figures, identical or identically acting constituent parts are in each case provided with the same reference symbols. The elements illustrated should not be regarded as true to scale. Rather, individual elements may be illustrated with an exaggerated size to afford a better understanding.

FIG. 1A shows, on the basis of a schematic sectional illustration, an optoelectronic semiconductor chip 100, comprising a semiconductor body 1. The semiconductor body 1 has an n-conducting region 12 and a p-conducting region 13, and also an active zone 11, which emits electromagnetic radiation during the operation of the semiconductor chip 100. The active zone 11 is arranged between the n-conducting region 12 and the p-conducting region 13. A passivation layer 6 is applied directly to an area 12A of the n-conducting region 12, the area lying opposite the active zone 11, wherein a structuring of the area 12A is transferred to the passivation layer 6 at least in places. In other words, a radiation coupling-out area 10 of the semiconductor chip 100 is formed by that area of the passivation layer 6 remote from the semiconductor body 1.

Furthermore, the optoelectronic semiconductor chip 100 has a single n-type contact element 2. Via the n-type contact element 2, the n-conducting region 12 is electrically contact-connected through the p-conducting region 13. The n-type contact element 2 comprises a cutout 21 in the p-conducting region, wherein the cutout 21 laterally delimits the p-conducting region 13 in places. Furthermore, the n-type contact element 2 has an n-type connection pad 211. The n-type connection pad 211 is formed exclusively by a semiconductor material of the n-conducting region 12. In this case, the cutout 21 has a side area 21A and a bottom area 21B. The side area 21A is formed completely by a semiconductor material of the p-conducting region 13, wherein a maximum vertical extent of the cutout 21 amounts to at least the vertical extent, that is to say thickness, of the p-conducting region 13. Furthermore, the bottom area 21B is formed completely by the semiconductor material of the n-conducting region. In other words, the n-type connection pad 211 is then formed completely by the bottom area 21B. The n-type connection pad 211 furthermore runs perpendicularly to a growth direction W of the semiconductor body 1, wherein the n-type connection pad 211 of the n-type contact element 2 amounts to at least 1% and at most 10%, preferably at least 2% and at most 5%, of a cross-sectional area 111 of the active zone 11. An n-type contact metallization 31 is arranged in places in the cutout 21 and is in direct contact with the connection pad 211 of the cutout 21 in places. Furthermore, a ratio of a maximum lateral extent $L_{max}$ of the active zone 11 to an n-type transverse conductivity of the n-conducting region 12 is 4 $\mu$m/($\Omega$/sq), for example.

The n-type contact metallization 31 is led out from the semiconductor body 1 in a lateral direction proceeding from the cutout 21. In other words, the n-conducting region 12 is "laterally" electrically contact-connected externally by the n-type contact metallization 31. In places an insulation layer 7 is applied to the n-type contact metallization 31 and the passivation layer 6 is applied directly to the insulation layer 7, wherein places of the contact metallization 31 free of the passivation layer 6 and the insulation layer 7 form an electrical contact region 5. The contact region 5 thus formed is an n-type contact region 51.

A p-type contact metallization 32 makes contact with the p-conducting region 13 of the semiconductor body 1 via a p-type connection pad 131 of the p-conducting region 12, the connection pad lying opposite the radiation coupling-out area 10. As illustrated in FIG. 1A, the p-type contact metallization 32 is likewise led out from the semiconductor body 1 in a lateral direction proceeding from the p-type connection pad 131, wherein the n-type contact metallization 31 and the p-type contact metallization 32 do not overlap one another in a vertical direction. In other words, the two contact metallizations 31 and 32 are led out from the semiconductor body 1 in different directions. Places that are free of the insulation layer 7 and the passivation layer 6 form a further contact region 5 in the form of a p-type contact region 52. Therefore, the optoelectronic semiconductor chip 100 is "laterally" electrically contact-connectable externally by the two contact regions 51 and 52.

Furthermore, the optoelectronic semiconductor chip 100 comprises an auxiliary carrier 9, wherein the auxiliary carrier, in particular, is not a growth substrate. The auxiliary carrier 9 can be a semiconductor wafer such as a wafer or plate, or a mechanically stable layer or plate formed with a metal, for example. Between the auxiliary carrier 9 and the semiconductor body 1, first, a connecting layer 8 is arranged on the auxiliary carrier 9. By way of example, the connecting layer 8 is an electrically conductive material such as a solder, for example. A carrier insulation layer 4 is arranged onto an area of the connecting layer 8 remote from the auxiliary carrier 9. The carrier insulation layer 4 and the connecting layer 8 connect the contact metallizations 31, 32 and the semiconductor body 1 to the auxiliary carrier 9 in a mechanically fixed manner. Furthermore, the carrier insulation layer 4 insulates both the n-type 31 and the p-type contact metallizations 32 completely from one another and also from the connecting layer 8 and/or the auxiliary carrier 9. Furthermore, the carrier insulation layer 4 is likewise arranged in the cutout 21 of the n-type contact element 2 in places. In other words, the carrier insulation layer 4 is directly applied completely on areas of the semiconductor body 1 and of the contact metallizations 31, 32 which lie opposite the radiation coupling-out area 10.

Figure 1B:
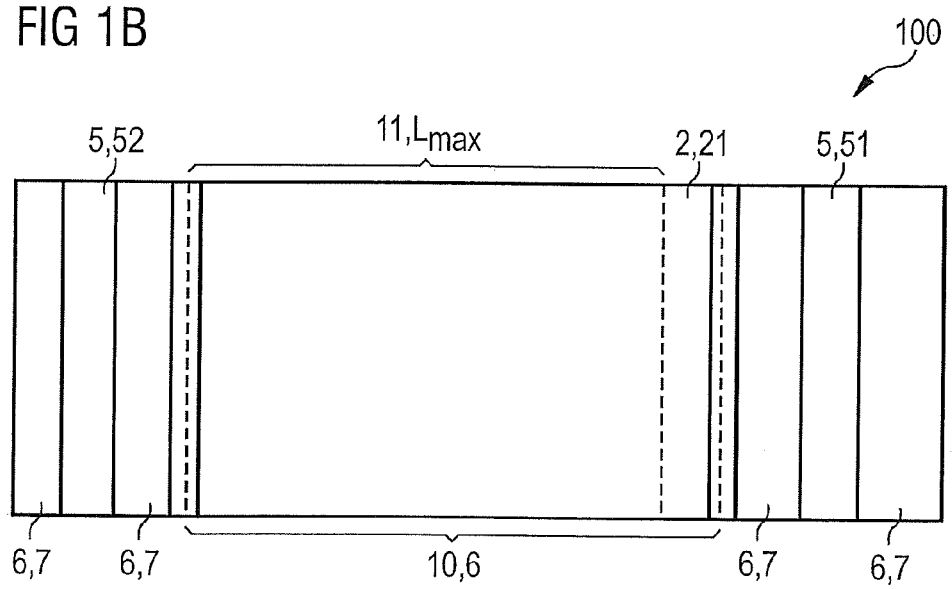

FIG. 1B shows the example in accordance with FIG. 1A in a schematic plan view. It can be discerned from the plan view that the optoelectronic semiconductor chip 100 has a rectangular basic form, wherein the cutout 21 forms a rectangular strip-shaped region that delimits the p-conducting region along one side in a lateral direction. It is likewise possible for the semiconductor chip 100 to have a basic form deviating from FIG. 1B. By way of example, the semiconductor chip 100 can be shaped in circular, oval or ellipsoidal fashion in a plan view. It is likewise possible for the cutout 21 to have a form deviating from that in FIG. 1B.

FIG. 2 shows, in a schematic side view, an example of an optoelectronic semiconductor device 1000 described here. The optoelectronic semiconductor device 1000 comprises two optoelectronic semiconductor chips 100 in accordance with at least one of the examples described here. To afford a better understanding, the optoelectronic semiconductor chip 100 illustrated on the left shall be designated hereinafter as an optoelectronic semiconductor chip 100A and the semiconductor chip 100 illustrated on the right shall be designated hereinafter as an optoelectronic semiconductor chip 100B. The two optoelectronic semiconductor chips 100A and 100B are electrically contact-connected to one another in a series circuit and separated from one another by a trench 1003. The n-conducting region 12 of the semiconductor chip 100A is electrically connected to the p-conducting region 13 of the semiconductor chip 100B via a continuous intermediate metallization 33. In this case, the intermediate metallization is formed completely by the n-type contact metallization 31 of the semiconductor chip 100A and by the p-type contact metallization 32 of the semiconductor chip 100B. In other words, the two contact metallizations 31 and 32 are "connected" to one another to form a common intermediate metallization 33. The n-type contact metallization 31, the p-type contact metallization 32 and the intermediate metallization 33 do not overlap in a vertical direction. The trench 1003 is formed by two side areas 1003C and a bottom area 1003A. Furthermore, the trench 1003 has an opening 1003D opposite the bottom area 1003A. The bottom area 1003A of the trench 1003 is formed by the intermediate metallization 33 running between the semiconductor chips 100A and 100B. An insulation layer 7 is applied directly to the bottom area 1003A of the trench 1003 in places. Furthermore, apart from the n-type and p-type contact locations 51 and 52, the passivation layer 6 is applied directly to uncovered places of the semiconductor body 1, of the trench 1003 and also of the insulation layer 7.

Figure 3:
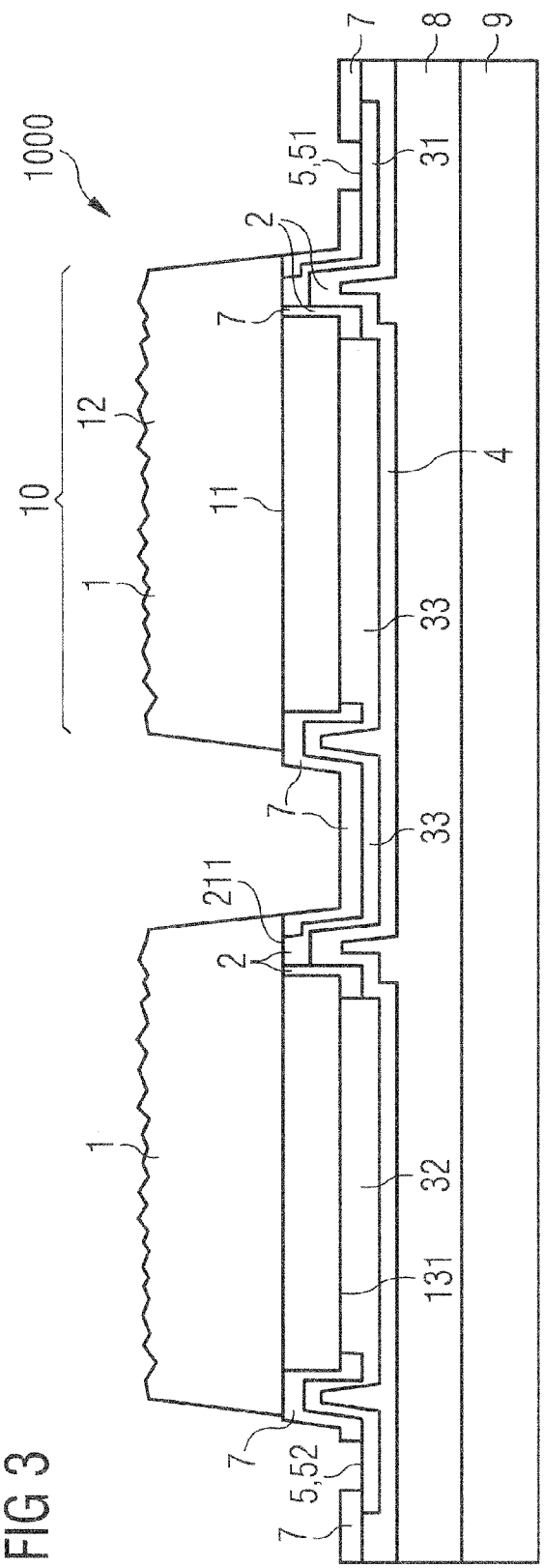

FIG. 3 shows a further example of an optoelectronic semiconductor device 1000 described here. In contrast to the example illustrated in FIG. 2, the cutouts 21 both of the semiconductor chip 100A and of the semiconductor chip 100B are circumferential around the p-conducting region 13 in a lateral direction and delimit the p-conducting region 13 on all sides in a lateral direction. Through the cutout 21, the active zone 11 is "pulled back" on all sides in a lateral direction in comparison with the n-conducting region 12. Between the metallizations 31, 32 and 33 and the n-conducting region 12 and p-conducting region 13, the insulation layer 7 is arranged in the region of the cutout 21 in places to avoid an electrical short circuit. Advantageously, the insulation layer 7 furthermore prevents oxidation of the active zone 11, as a result of which, for example, it is possible to dispense with applying the passivation layer 6 in the region of the active zone. Furthermore, in the case of the example illustrated in FIG. 2, the radiation coupling-out area 10 is formed completely by the area 12A of the n-conducting region 12, wherein the radiation coupling-out area 10 is structured in this example as well.

Figure 4:
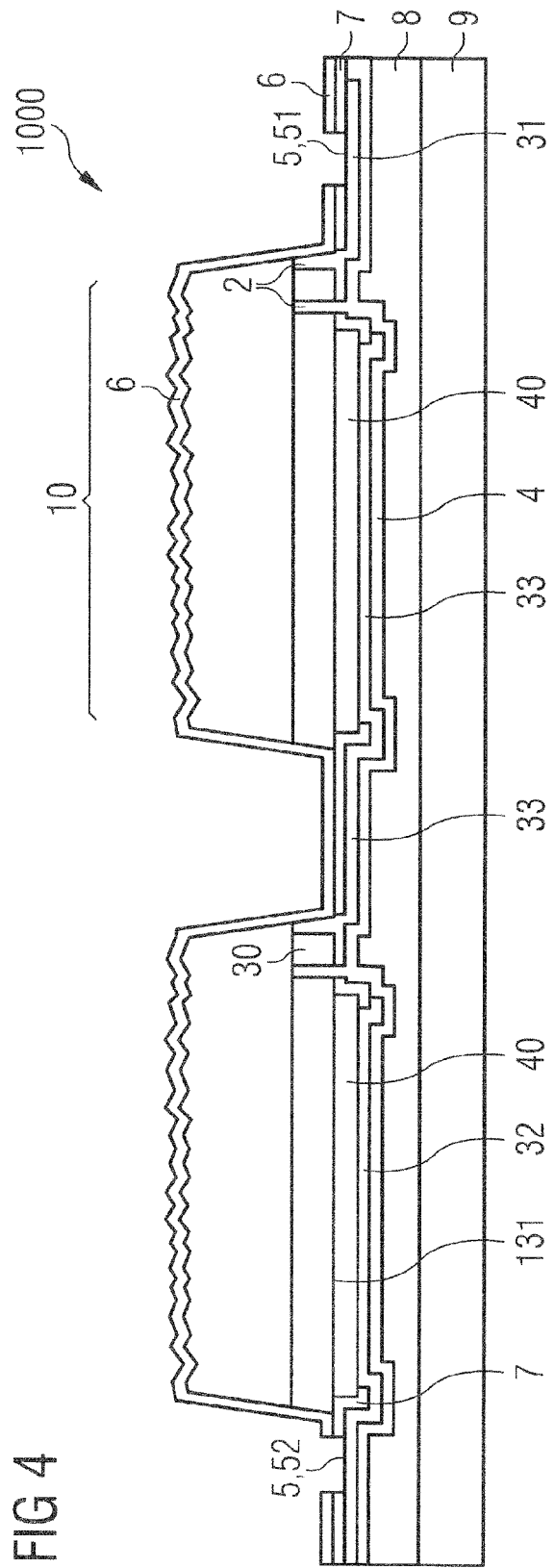

FIG. 4 shows a further example of an optoelectronic semiconductor device 1000 described here. In contrast to the example illustrated in FIG. 2, the optoelectronic semiconductor device 1000 has n-type mirror layers 30 and p-type mirror layers 40. By way of example, the two mirror layers 30 and 40 are formed with an electrically conductive material. The n-type mirror layer 30 is arranged in places in each case in the cutout 21 of the n-type contact element 2 and is in direct contact with the n-type connection pad 211 at least in places. The p-type mirror layer 40 is applied directly to the p-type connection pad 131 at least in places. Electromagnetic radiation emitted by the active zone 11 in the direction of the p-type connection pad 131 can advantageously be reflected back by the n-type mirror layer 30 and the p-type mirror layer 40 in the direction of the radiation coupling-out areas 10. Advantageously, therefore, the mirror layers 30 and 40 increase the coupling-out efficiency of the individual semiconductor chips 100. In this context, "coupling-out efficiency" means the ratio between luminous energy primarily generated in the semiconductor chips 100A and 100B and luminous energy coupled out from the semiconductor chips 100A and 100B.

Figure 5:
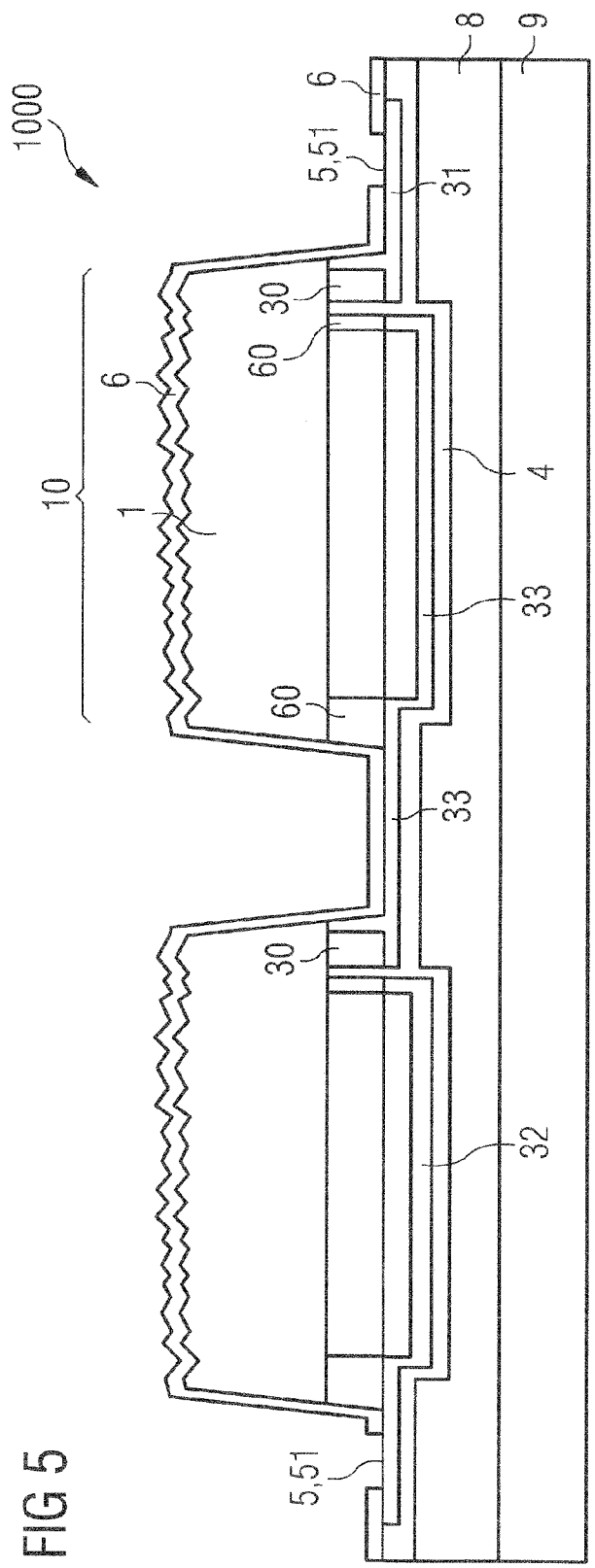

In the example illustrated in FIG. 5 of an optoelectronic semiconductor device 1000 described here, in contrast to the example shown in FIG. 4, the p-conducting region is laterally delimited by a nominally undoped semiconductor region 60 on all sides in a lateral direction. The nominally undoped semiconductor region 60 and the p-conducting region 13 are formed by a continuous and contiguous semiconductor layer. In this case, the nominally undoped semiconductor region 60 is electrically insulating. Advantageously, therefore, it is possible to dispense with an insulation layer 7, in particular in the region between the metallizations 31, 32 and 33 and the n-conducting region 12 and the p-conducting region 13.

In this context, it is also possible for the n-type contact element 2 to be formed at least in places by a correspondingly overdoped semiconductor material of the p-conducting region 13. In other words, the correspondingly overdoped semiconductor material can then make electrical contact with the n-conducting region such that, advantageously, an n-type contact metallization 31 in the region of the cutout can be partly dispensed with.

FIGS. 6A to 6E show individual manufacturing steps for producing an optoelectronic semiconductor device 1000 described here.

Figure 6A:
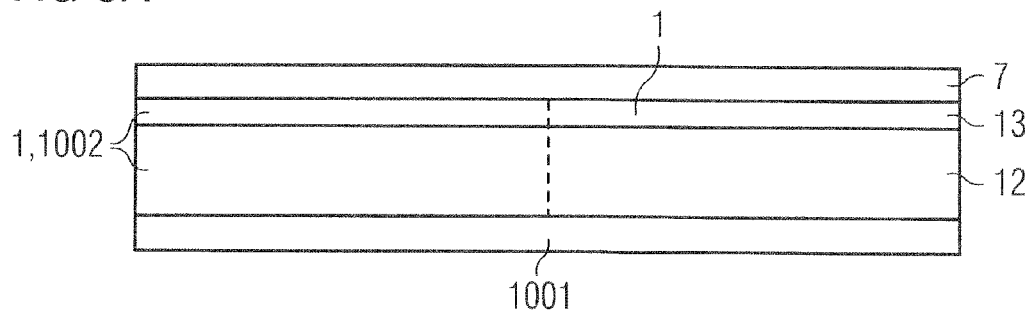
FIGS. 6A to 6E show, on the basis of schematic sectional illustrations, individual manufacturing steps for producing an example of an optoelectronic semiconductor device described here.

In FIG. 6A, in a first step, a growth carrier 1001 is first provided. By way of example, the growth carrier is a semiconductor wafer such as a wafer or plate. A semiconductor layer sequence 1002 is deposited epitaxially onto the growth carrier 1001. The semiconductor layer sequence 1002 has an n-conducting region 12 and a p-conducting region 13. Furthermore, an insulation layer 7 is completely applied to an area of the n-conducting region 13 remote from the growth carrier 1.

Figure 6B:
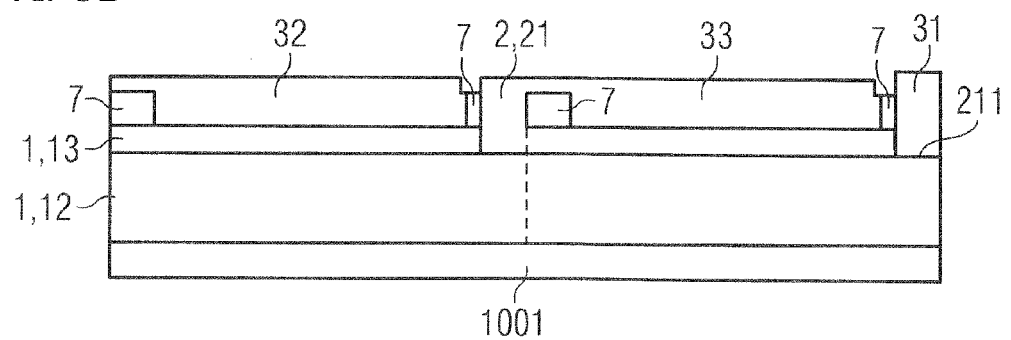
Figure 6C:
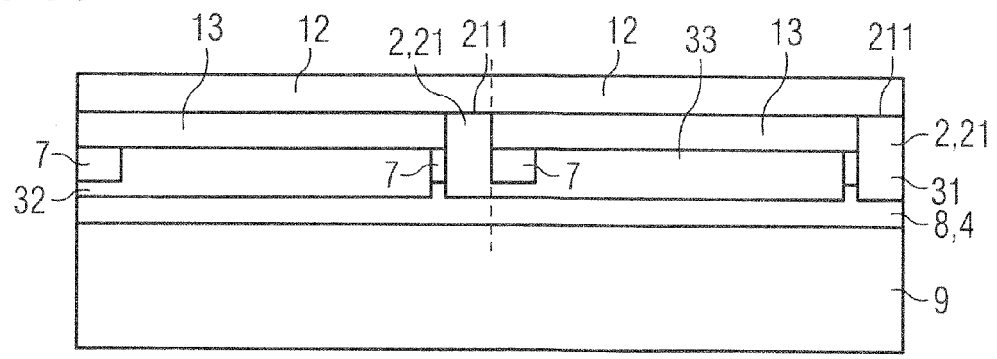

FIG. 6B shows a next step, wherein two n-type contact elements 2 are produced into the semiconductor layer sequence 1002. For this purpose, the insulation layer 7 is first removed again at least in the regions of the later n-type contact elements 2. In a next step, for example, by a dry- or wet-chemical etching process, the cutouts 21 are introduced into the p-conducting region 13, wherein the cutouts 21 extend through the p-conducting region 13 right into the n-conducting region 12.

In a next step, the insulation layer 7 is removed from the p-conducting region 13 in places and an n-type contact metallization 31 and a p-type contact metallization 32 and also an intermediate metallization 33 are applied at places uncovered as a result.

In a next step, a carrier insulation layer 4 is completely applied to exposed areas of the metallizations 31, 32, 33, of the insulation layer 7 and also the semiconductor body 1.

In a further step, a connecting layer 8, for example, a metallic solder, is then applied to that area of the carrier insulation layer 4 remote from the semiconductor layer sequence 1002.

In a next step, an auxiliary carrier 9 is applied to that area of the connecting layer 8 which lies opposite the growth carrier 1001. The growth carrier 1001 is subsequently removed from the semiconductor layer sequence 1002 (also see FIG. 6C).

Figure 6D:
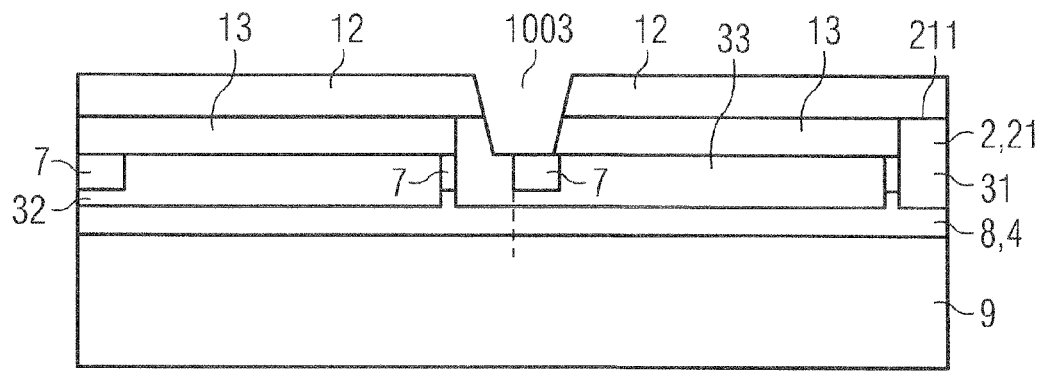

FIG. 6D illustrates how, in a next step for producing individual semiconductor bodies 1, a trench 1003 is introduced into the semiconductor layer sequence 1002 via the n-conducting region 12 between n-type contact elements 2 that are adjacent in a lateral direction. The trench 1003 is formed by a dry- or wet-chemical etching process, for example. In this case a bottom area 1003A of the trench 1003 is formed in places by the insulation layer 7, wherein side areas 1003C of the trench 1003 are formed partly by the semiconductor layer sequence 1002. In other words, the semiconductor layer sequence 1002 is completely removed in places in the region of the trench 1003.

Figure 6E:
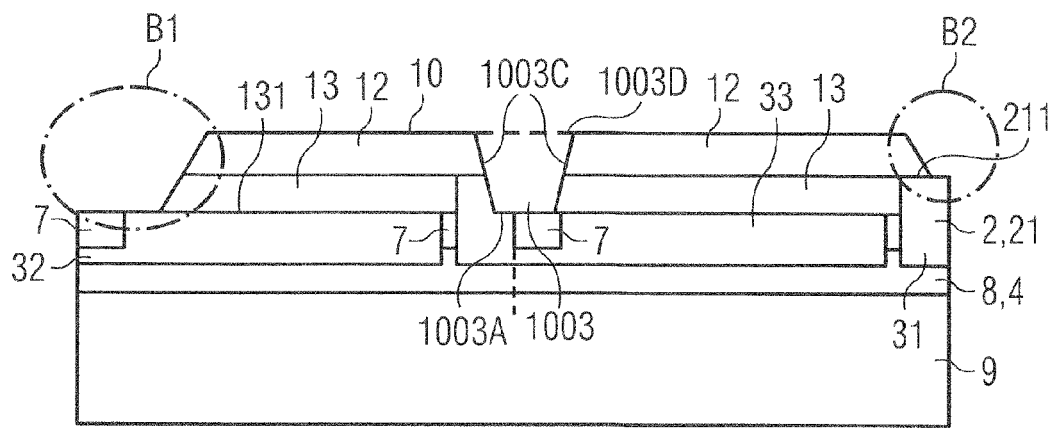

FIG. 6E illustrates how the semiconductor layer sequence 1002 is partly removed in regions B1 and B2. In other words, the semiconductor bodies 1 taper proceeding from p-type connection pads 131 in the direction of radiation coupling-out areas 10. By way of example, one or a plurality of passivation layers 6 can be applied to free places of the semiconductor bodies 1, of the insulation layer 7 and/or of the contact metallizations 31, 32 and 33, wherein the contact metallizations 31 and 32, for the purpose of external electrical contact-connection, in places have a region that is free of the insulation layer 7 and the passivation layer 6.

By way of example, these regions of the contact metallizations 31 and 32 then form n-type 51 and p-type contact regions 52.

This disclosure is not restricted by the description on the basis of the examples. Rather, my chips, devices and methods encompass any novel feature and also any combination of features, which in particular includes any combination of features in the appended claims, even if the feature or combination itself is not explicitly specified in the claims or the examples.

The invention claimed is:

1. An optoelectronic semiconductor chip comprising:
   a semiconductor body having an n-conducting region and a p-conducting region;
   a single n-type contact element via which the n-conducting region can be electrically contact-connected through the p-conducting region,
   wherein the n-type contact element comprises a cutout in the p-conducting region,
   the n-type contact element laterally delimits the p-conducting region at least in places,
   the n-type contact element has an n-type contact metallization which directly adjoins the n-conducting region,
   the p-conducting region electrically conductively connects to a p-type contact metallization, and
   the n-type contact metallization and the p-type contact metallization are led out from the semiconductor body in a lateral direction so that they laterally exceed the n-conducting region and the p-conducting region and so that they do not overlap one another in a vertical direction;
   a carrier insulation layer completely covering in a positively locking manner and directly adjoining those sides of the n-type and the p-type contact metallization and the semiconductor body remote from the n-conducting region, wherein the carrier insulation layer at the same time fills partially an area in between the n-type and the p-type contact metallizations; and
   an auxiliary carrier placed on that side of the n-type and the p-type contact metallization remote from the semiconductor body, wherein the carrier insulation layer completely electrically isolates the n-type and the p-type contact metallization from one another and at the same time from the auxiliary carrier.

2. The optoelectronic semiconductor chip according to claim 1, wherein the n-type contact element has an n-type connection pad comprising a semiconductor material of the n-conducting region, wherein the n-type connection pad runs perpendicularly to a growth direction (W) of the semiconductor body.

3. The optoelectronic semiconductor chip according to claim 2, wherein the semiconductor body has an active zone, and the n-type connection pad of the n-type contact element amounts to at least 1% and at most 10% of a cross-sectional area of the active zone.

4. The optoelectronic semiconductor chip according to claim 1, wherein the semiconductor body has a radiation coupling-out area arranged at a side of the n-conducting region remote from the p-conducting region.

5. The optoelectronic semiconductor chip according to claim 2, wherein the n-type contact metallization directly adjoins the n-type connection pad at least in selected places.

6. The optoelectronic semiconductor chip according to claim 4, wherein the p-conducting region has a p-type connection pad lying opposite the radiation coupling-out area, and the p-type connection pad is electrically conductively connected to the p-type contact metallization.

7. The optoelectronic semiconductor chip according to claim 6, wherein an insulation layer is arranged between the p-conducting region and the n-type contact metallization in the region of the cutout.

8. The optoelectronic semiconductor chip according to claim 1, wherein the p-conducting region is laterally delimited in places by a nominally undoped semiconductor region, and the nominally undoped semiconductor region and the p-conducting region are formed by a continuous and contiguous semiconductor layer.

9. The optoelectronic semiconductor chip according to claim 1, wherein the n-type contact element comprises an overdoped n-conducting semiconductor material of the p-conducting region.

10. An optoelectronic semiconductor device comprising:
    at least two optoelectronic semiconductor chips according to claim 1, wherein
    the optoelectronic semiconductor chips are electrically contact-connected to one another in a series circuit,
    the n-conducting region of a semiconductor chip is electrically connected to the p-conducting region of an adjacent semiconductor chip via a continuous intermediate metallization which is a single continuous metal layer, and
    the intermediate metallization is formed at least in selected places by the n-type contact metallization of a semiconductor chip and by the p-type contact metallization of an adjacent semiconductor chip.

11. An optoelectronic semiconductor chip comprising:
    a semiconductor body having an n-conducting region and a p-conducting region;
    a single n-type contact element via which the n-conducting region can be electrically contact-connected through the p-conducting region,
    the n-type contact element comprises a cutout in the p-conducting region,
    the n-type contact element laterally delimits the p-conducting region at least in places,
    the n-type contact element has an n-type contact metallization which directly adjoins the n-conducting region,
    the p-conducting region electrically conductively connects to a p-type contact metallization, and
    the n-type contact metallization and the p-type contact metallization are led out from the semiconductor body in a lateral direction so that they laterally exceed the n-conducting region and the p-conducting region and so that they do not overlap one another in a vertical direction;
    a carrier insulation layer completely covering in a positively locking manner and directly adjoining those sides of the n-type and the p-type contact metallization and the semiconductor body remote from the n-conducting region, wherein the carrier insulation layer at the same time fills partially an area in between the n-type and the p-type contact metallizations; and
    an auxiliary carrier placed on that side of the n-type and the p-type contact metallization remote from the semiconductor body, wherein the carrier insulation layer completely electrically isolates the n-type and p-type contact metallization from one another and at the same time from the auxiliary carrier, and a side of the auxiliary carrier facing toward the semiconductor body is planar.

* * * * *